(12) United States Patent
Jones, Jr.

(10) Patent No.: US 6,339,346 B1
(45) Date of Patent: Jan. 15, 2002

(54) LOW SKEW SIGNAL GENERATION CIRCUIT

(75) Inventor: Oscar Frederick Jones, Jr., Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 09/651,609

(22) Filed: Aug. 30, 2000

(51) Int. Cl.[7] .................. H03K 19/096; H03B 19/00
(52) U.S. Cl. ........................... 326/93; 327/122
(58) Field of Search ................ 326/93, 96; 327/116, 327/119, 122, 407, 291, 298

(56) References Cited

U.S. PATENT DOCUMENTS

| | | |
|---|---|---|
| 4,355,283 A | 10/1982 | Ott |
| 4,988,892 A | 1/1991 | Needle |
| 5,204,559 A | 4/1993 | Deyhimy et al. |
| 5,397,943 A | 3/1995 | West et al. |
| 5,635,866 A * | 6/1997 | Monk et al. ............... 327/116 |
| 5,703,509 A * | 12/1997 | Hirata ....................... 327/119 |
| 6,222,411 B1 * | 4/2001 | Chu et al. .................. 327/295 |

* cited by examiner

Primary Examiner—Michael Tokar
Assistant Examiner—James H Cho
(74) Attorney, Agent, or Firm—Cook, Alex, McFarron, Manzo, Cummings & Mehler, Ltd.

(57) ABSTRACT

The disclosure is directed to a clock doubler circuit for generating a double frequency clock signal from first, second, third and fourth input clock signals. The clock doubler circuit includes four input differential buffers having a relatively low skew path between one of their respective input terminals and their respective output terminals. The clock doubler circuit also includes an exclusive-or logic circuit coupled to the first, second, third and fourth input differential buffers through their respective output terminals. The clock doubler circuit is in the form of three coupled NAND gates, preferably having low skew.

24 Claims, 6 Drawing Sheets

LOW SKEW SIGNAL GENERATION CIRCUIT

BACKGROUND OF THE INVENTION

The present invention is generally directed to control circuitry for producing timing signals for electronic circuits, and more particularly to an electronic circuit having low skew differential input buffers, one for each critical transition of the input signals, for receiving differential multiphase input signals and producing a low skew output timing signal.

It is generally known in the electronics art that timing signals often control the functions of circuits contained within an electronic circuit system. Timing signals are produced by their own circuits and generally propagate to each circuit within the electronic circuit system to effectuate control thereof.

It is also generally known in the electronics art that in certain applications it is desirable to increase and/or decrease the frequency of timing signals incorporated in an electronic circuit system. Often, the frequency of the timing signals is doubled or tripled, and other times it is divided, such as in half. The advantages of clock doublers and the like are well known in the art.

It is further well known in the art that timing signal generation circuitry typically uses input signals received by conventional differential buffers/receivers. One common drawback of the prior art is that use of conventional differential buffers/receivers produces a high edge timing skew on the generated timing signal. This relatively high skew is attributable to the inherent skew of the differential buffer/receiver.

In particular, CMOS input buffers are typically used as the conventional differential buffers/receivers in such circuitry. CMOS differential input buffers, particularly those used to receive restricted swing signal (SSTL) or differential input signals, ordinarily have considerable skew (i.e., timing variations) produced at their output signals in response to input signals transitioning from one state to another. Often, the skew is more noticeable as a result of the low-to-high input signal transition as opposed to its high-to-low transition, or vice versa. This condition is most readily apparent when the input buffers have hysteresis in order improve noise immunity.

When clock buffers, which have different output delays from different input transitions, are used in timing signal generation circuitry, the timing signal generated is relatively accurate, but has a considerable skew in at least every occurrence of one of its transitions.

Figure 6:
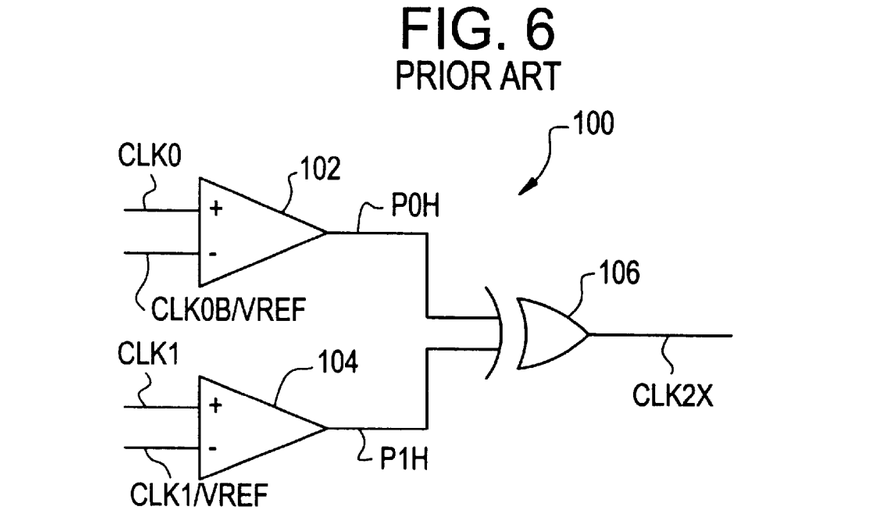
FIG. 6 is a circuit schematic diagram illustrating a conventional clock doubler circuit.

Illustrating these principles, FIG. 6 shows a conventional clock doubler circuit generally designated 100 having a first input buffer 102, a second input buffer 104 and an exclusive-or (XOR) logic gate 106. A first input clock signal CLK0 is applied to the noninverting input terminal of input buffer 102, while its complement CLK0B, or alternatively a voltage reference signal VREF, is applied to the inverting input terminal of input buffer 102. A second input clock signal CLK1, which is ninety degrees out of phase with respect to first input clock signal CLK0, is applied to the noninverting input terminal of input buffer 104. Its complement CLK1B, or alternatively the voltage reference signal VREF, is applied to the inverting input terminal of input buffer 104. The output terminals of input buffers 102, 104 are connected to the input terminals of XOR gate 106 to generate a double frequency timing signal CLK2X at the output terminal of XOR gate 106. As will be appreciated by those skilled in the art, conventional clock doubler circuit 100 does not compensate for the inherent skew present in the input buffers 102, 104 shown in FIG. 6.

Figure 7:
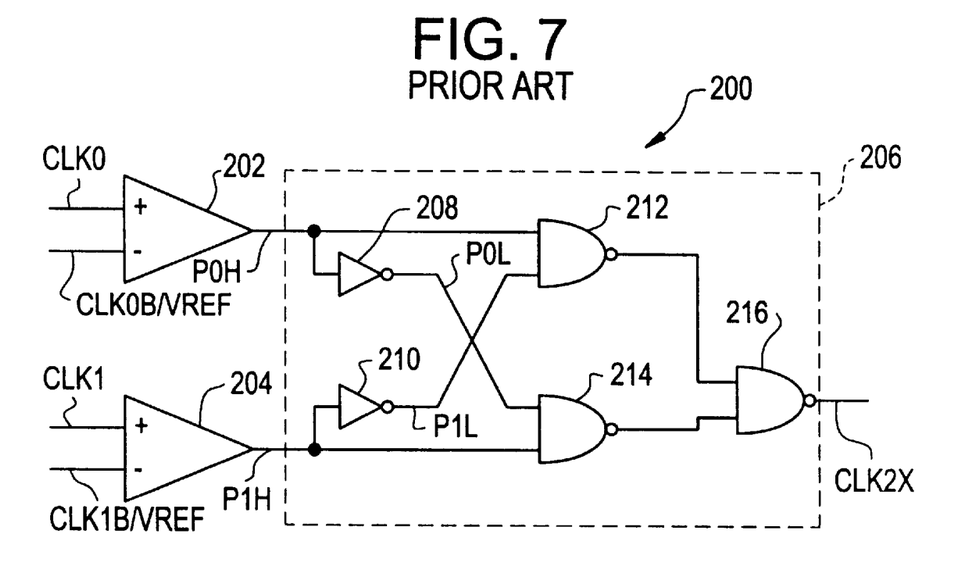
FIG. 7 is a circuit schematic diagram illustrating an alternative conventional clock doubler circuit.

FIG. 7 illustrates another conventional clock doubler circuit generally designated 200 having a first input buffer 202, a second input buffer 204, and an exclusive-or (XOR) equivalent circuit designated 206. Exclusive-or circuit 206 includes two invertors 208, 210 and three NAND gates 212, 214, 216. As shown, a first input clock signal CLK0 is applied to the noninverting input terminal of input buffer 202, while its complement CLK0B, or alternatively a voltage reference signal VREF, is applied to the inverting input terminal of input buffer 202 to generates an edge timing signal P0H at the output terminal of input buffer 202. A second input clock signal CLK1, which is ninety degrees out of phase with respect to first input clock signal CLK0, is applied to the noninverting input terminal of input buffer 204. Its complement CLK1B, or alternatively the voltage reference signal VREF, is applied to the inverting input terminal of input buffer 204 to generate an edge timing signal P1H at the output terminal of input buffer 204.

The output terminal of input buffer 202 is connected to the input terminals of inverter 208 and NAND gate 212. Similarly, the output terminal of input buffer 204 is connected to the input terminals of inverter 210 and NAND gate 214. Inverter 208 generates a signal emulating edge timing signal P0L at its output terminal, which is connected to NAND gate 214. Similarly, inverter 210 generates a signal emulating edge timing signal P1L at its output terminal, which is connected to NAND gate 212. The respective output terminals for NAND gates 212, 214 are connected to the input terminals of NAND gate 216, which generates a double frequency timing signal CLK2X at its output terminal. As will be appreciated by those skilled in the art, clock doubler circuit 200 also does not compensate for the inherent skew present in the input buffers 202, 204 shown in FIG. 7.

Accordingly, while prior art timing signal generation circuitry is suitable for certain, limited applications, the timing skew attributable to such circuitry limits performance of the electronic circuit system under control.

In light of the foregoing, it is therefore desirable to develop a timing signal generation circuit that minimizes the skew attendant to input differential buffers used in that circuit.

It is also desirable to design a timing signal generation circuit that uses multiple input differential buffers on each critical edge of the output timing signal.

It is further desirable to design a clock doubler circuit that uses two separate differential signal inputs, or a total of four clock signals, to generate a low skew double frequency output signal.

It is yet further desirable to design a circuit as previously described in which the four clock signals are produced by two identical frequency signals that are ninety degrees out of phase, along with their complement signals.

It is still further desirable to design a timing signal generation circuit that includes a buffer for each edge of the output timing signal such that the output of each buffer uses the lowest skew path of the buffer and each input-to-output path is matched.

These and other objects of the preferred form of the invention will become apparent from the following description. It will be understood, however, that a circuit could appropriate the invention claimed herein without accomplishing each and every one of these objects, including those gleaned from the following description. The appended claims, not the objects, define the subject matter of this invention. Any and all objects are derived from the preferred form of the invention, not the invention in general.

SUMMARY OF THE INVENTION

The present invention is directed to a timing signal generation circuit for generating a timing signal having a predetermined number of critical transitions from a plurality of input timing signals. The circuit includes an input differential buffer for each critical transition of the timing signal. Each buffer has first and second input terminals and an output terminal. Each buffer further has a first response between its first input terminal and its output terminal and a second response between its second input terminal and its output terminal. The first response provides a generally lower skew than the second response. In this circuit, two different ones of the input timing signals are applied to the first and second input terminals of each buffer to generate a critical edge timing signal at an output terminal of each buffer indicative of a lowest skew path for a particular one of the predetermined number of critical transitions of said timing signal. The circuit also includes a logic circuit coupled to each buffer through the respective output terminals thereof.

In a preferred form, the present invention is directed to a clock doubler circuit for generating a double frequency clock signal from first, second, third and fourth input clock signals. In this arrangement, the first and second input clock signals share a common frequency and are complements of each other, while the third and fourth input clock signals share that same common frequency and are complements of each other. Further, the first and third input clock signals are ninety degrees out of phase with respect to each other. The clock doubler circuit includes a first input differential buffer having a first buffer first input terminal, a first buffer second input terminal, and a first buffer output terminal. The first input clock signal is applied to the first buffer first input terminal and the second input clock signal is applied to the first buffer second input terminal. The clock doubler circuit further includes a second input differential buffer having a second buffer first input terminal, a second buffer second input terminal, and a second buffer output terminal. The fourth input clock signal is applied to the second buffer first input terminal and the third input clock signal is applied to the second buffer second input terminal. Still further, the clock doubler circuit includes a third input differential buffer having a third buffer first input terminal, a third buffer second input terminal, and a third buffer output terminal. The third input clock signal is applied to the third buffer first input terminal and the fourth input clock signal is applied to the third buffer second input terminal. Yet further, the clock doubler circuit includes a fourth input differential buffer having a fourth buffer first input terminal, a fourth buffer second input terminal, and a fourth buffer output terminal. The second input clock signal is applied to the fourth buffer first input terminal and the first input clock signal is applied to the fourth buffer second input terminal. Finally, the clock doubler circuit includes an exclusive-or logic circuit coupled to the first, second, third and fourth input buffers through respective ones of the first, second, third and fourth buffer output terminals.

BRIEF DESCRIPTION OF THE DRAWINGS

In the following detailed description, reference will frequently be made to the following drawings, in which like reference numerals refer to like components, and in which.

DETAILED DESCRIPTION OF THE PREFERRED EMBODIMENTS

Figure 1:
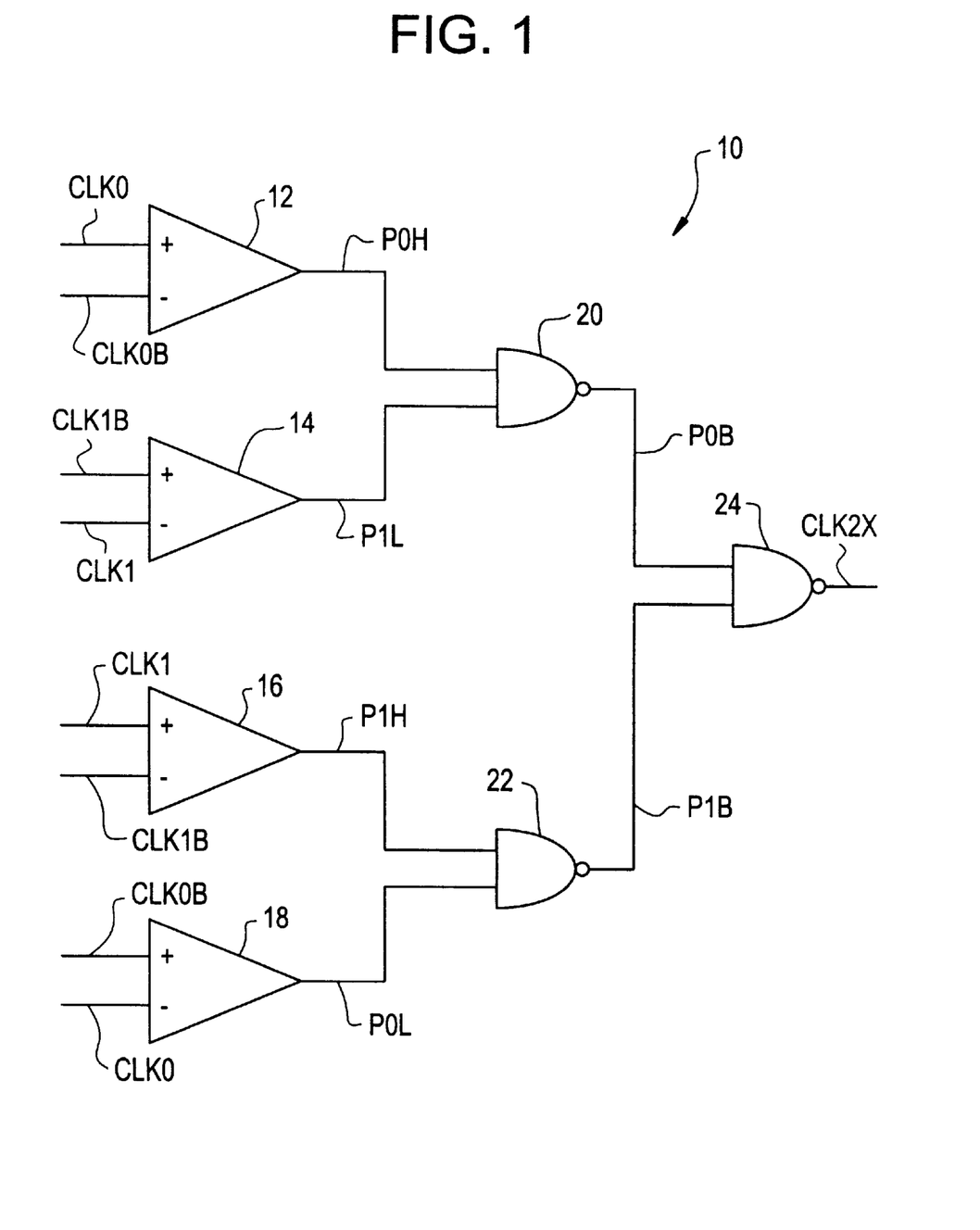
FIG. 1 is a circuit schematic diagram illustrating a timing signal generation circuit constructed in accordance with the principles of the present invention.

FIG. 1 illustrates a clock doubler circuit generally designated 10 having four generally identical input differential buffers 12, 14, 16 and 18. The clock doubler circuit 10 further includes three NAND gates 20, 22, 24. As shown, input differential buffer 12 and input differential buffer 14 are electrically connected to NAND gate 20. Similarly, input differential buffer 16 and input differential buffer 18 are electrically connected to NAND gate 22. NAND gate 20 and NAND gate 22 are electrically connected to NAND gate 24.

As further shown, input differential buffer 12 has a noninverting input terminal to which a first timing signal designated CLK0 is applied. Input differential buffer 12 also has an inverting input terminal that carries a second timing signal designated CLK0B, which is the complement of the first timing signal designated CLK0. From these two timing signals, input differential buffer 12 generates a first critical edge timing signal designated P0H.

Input differential buffer 18 also utilizes the first and second timing signals CLK0 and CLK0B. In the case of input differential buffer 18, however, CLK0 is applied to its inverting input terminal and CLK0B is applied to its noninverting input terminal. Input differential buffer 18 generates a second critical edge timing signal designated P0L.

Input differential buffer 16 has a noninverting input terminal to which a third timing signal designated CLK1 is applied. Input differential buffer 16 also has an inverting input terminal that carries a fourth timing signal designated CLK1B, which is the complement of the third timing signal designated CLK1. From these two timing signals, input differential buffer 16 generates a third critical edge timing signal designated P1H.

Input differential buffer 14 also utilizes the third and fourth timing signals CLK1 and CLK1B. In the case of input differential buffer 14, however, CLK1 is applied to its inverting input terminal and CLK1B is applied to its noninverting input terminal. Input differential buffer 14 generates a fourth critical edge timing signal designated P1L.

Still referring to FIG. 1, critical edge timing signals P0H and P1L are input signals to NAND gate 20, and similarly critical edge timing signals P1H and P0L are input signals to NAND gate 22. The output signals generated by NAND gate 20 and NAND gate 22 (designated P0B and P1B, respectively) serve as input signals for NAND gate 24. The output signal generated by NAND gate 24 is a signal designated CLK2X having twice the frequency of timing signals CLK0, CLK0B, CLK1 and CLK1B.

Figure 2:
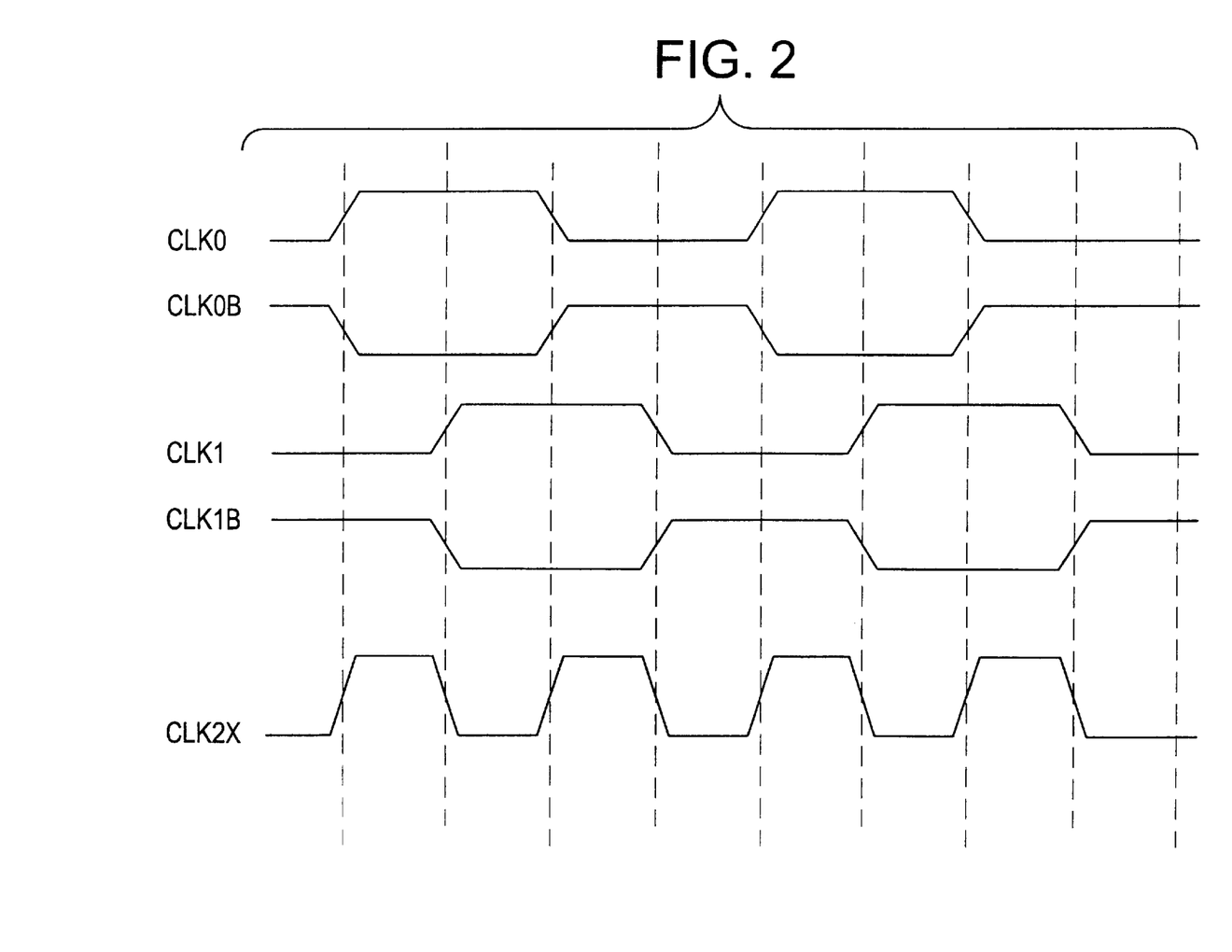
FIG. 2 is a timing diagram illustrating the relationship between certain of the signals present during operation of the circuit illustrated in schematic form in FIG. 1.

FIG. 2 illustrates a timing diagram showing timing signals CLK0 and CLK1, which are ninety degrees out of phase, along with their respective complement timing signals CLK0B and CLK1B. Also shown in FIG. 2 is the output signal generated by NAND gate 24 and designated CLK2X. As shown, signal CLK2X is twice the frequency of timing signals CLK0 and CLK1 when those signals (and their complements CLK0B and CLK1B, respectively) are ninety degrees out of phase with respect to each other.

As further shown, double frequency timing signal CLK2X is responsive to each positive edge transition of timing signals CLK0, CLK0B, CLK1 and CLK1B. Because, in the illustrated embodiment, each of those positive edge transitions follows the lowest skew path of its respective input buffer, the skew of double frequency timing signal CLK2X is minimal.

Figure 3:
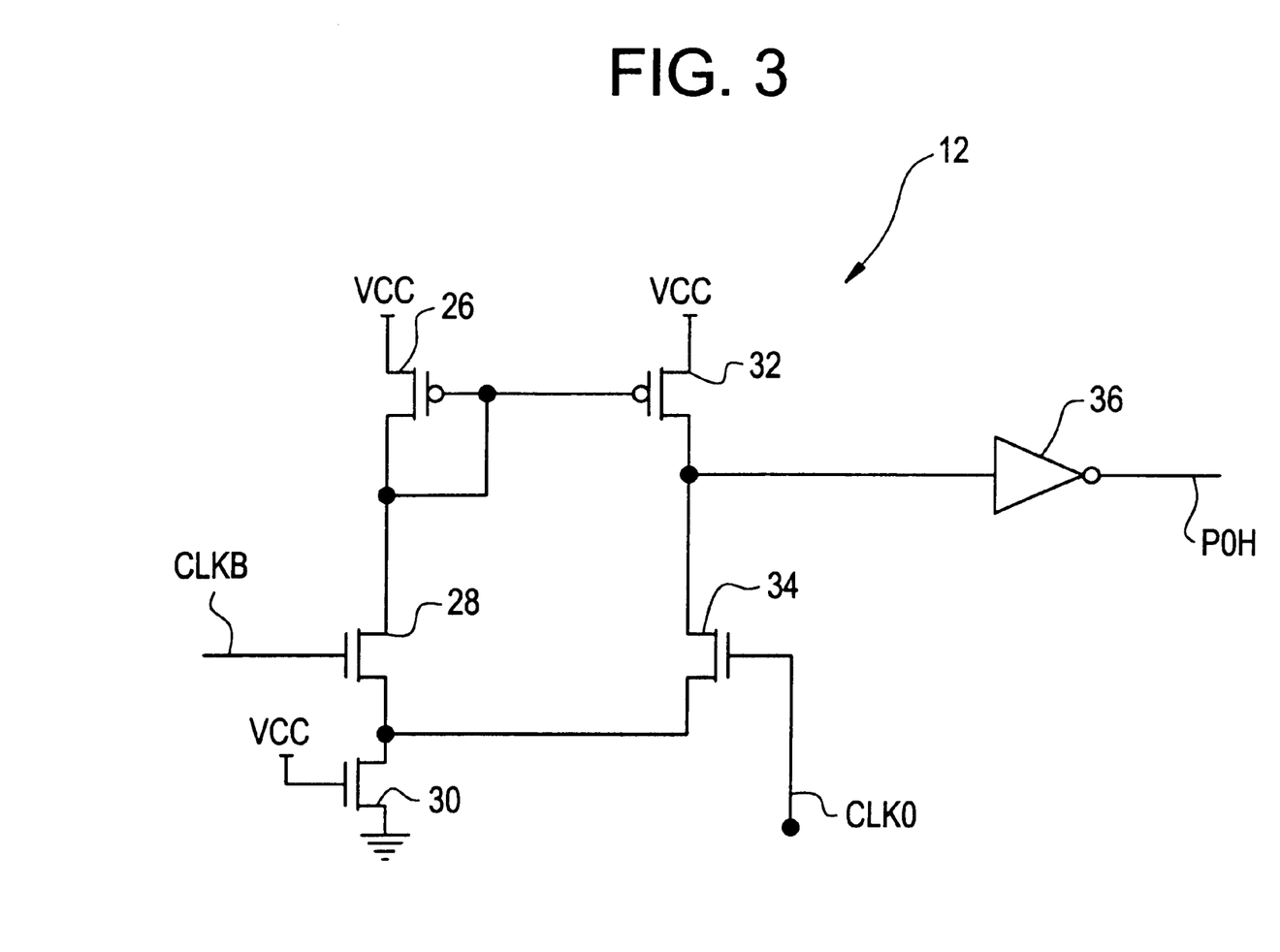
FIG. 3 is a circuit schematic diagram illustrating components preferably included within each of the input differential buffers depicted in FIG. 1.
Figure 4:
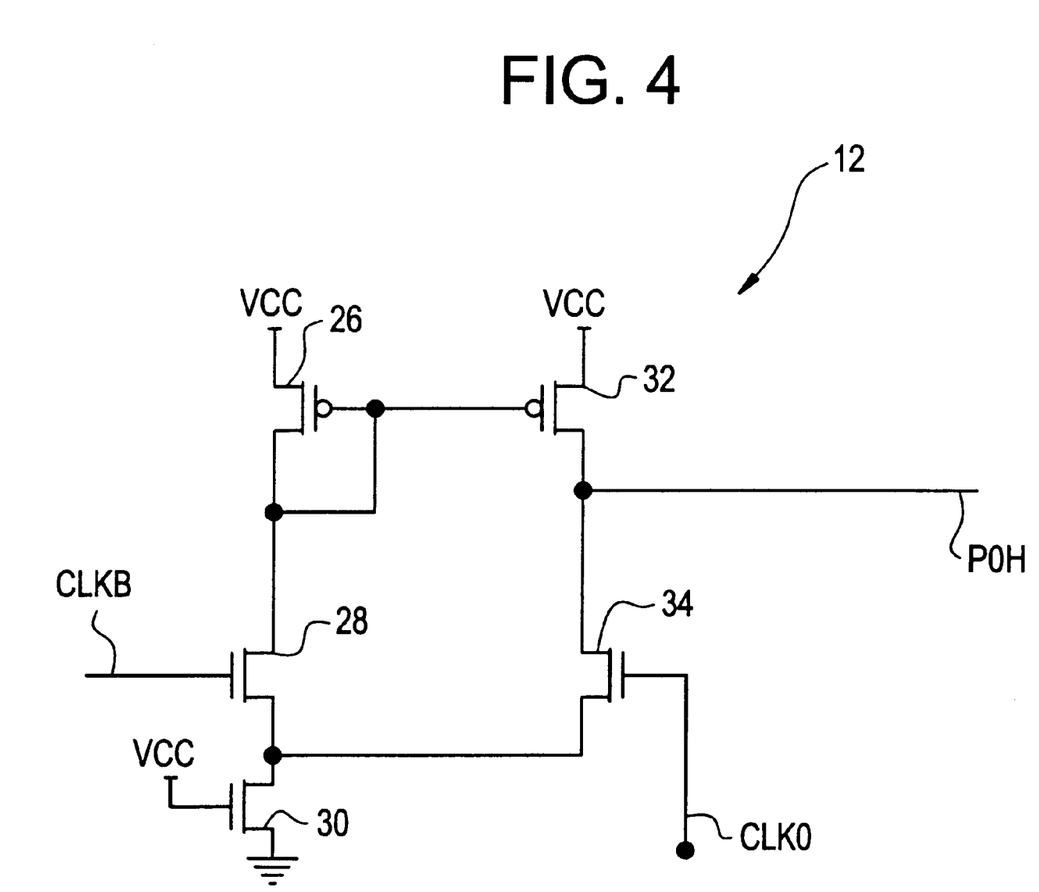
FIG. 4 is a circuit schematic diagram illustrating an alternative embodiment of components preferably included within each of the input differential buffers depicted in FIG. 1.

It will be appreciated by those skilled in the art that the input differential buffers 12, 14, 16 and 18 shown in FIG. 1, FIG. 3 and FIG. 4 have been assumed to be identical and to have their lowest skew path from their respective noninverting input terminals to their respective output terminals. In other input differential buffers available for use, the lowest skew path might be from their respective inverting input terminals to their respective output terminals. In such circumstances, it will be appreciated that the circuitry disclosed herein can be modified accordingly, as the case may be, to take advantage of the principles of the present invention.

FIG. 3 illustrates representative circuitry that can be used for the input differential buffers 12, 14, 16 and 18 shown in FIG. 1. FIG. 3 in particular illustrates a preferred from for input differential buffer 12, but it will be understood by those skilled in the art that input differential buffers 14, 16 and 18 could, and in fact preferably will, include identical circuit components. Those skilled in the art will also recognize that input differential buffer 12, as shown in FIG. 3, is an analog integrated circuit.

As shown in FIG. 3, timing signals CLK0 and CLK0B are input signals to input differential buffer 12, and critical edge timing signal P0H is generated by the buffer and connects as an input to the exclusive-or (XOR) circuitry for the clock doubler (see FIG. 1).

FIG. 3 illustrates a preferred embodiment for input differential buffer 12 wherein it includes five transistors designated 26, 28, 30, 32 and 34, and an inverter designated 36. For illustrative purposes, transistors 26 and 32 are shown as PMOS transistor devices, while transistors 28, 30 and 34 are shown as NMOS transistor devices. In that regard, input differential buffer 12 is shown illustratively as implementing CMOS technology.

As further shown, the source terminal of transistor 26 is electrically connected to a voltage source generally designated VCC by those skilled in the art. The gate electrode and drain terminal of transistor 26 are electrically connected together by a conductor, and are electrically connected to the gate electrode of transistor 32 and the drain terminal of transistor 28.

Transistor 28 is controlled by timing signal CLK0B, which is applied to its gate electrode. The source terminal of transistor 28 is electrically connected to the drain terminal of transistor 30 and the source terminal of transistor 34.

Voltage source VCC is applied to the gate electrode of transistor 30, and a reference voltage generally referred to as ground or VSS by those skilled in the art is applied to its source terminal.

Voltage source VCC is applied to the source terminal of transistor 32. The drain terminal of transistor 32 is electrically connected to the input terminal for inverter 36 and to the drain terminal for transistor 34. Timing signal CLK0 is applied to the gate electrode of transistor 34 to control its operation.

In operation, transistor 30 is continuously enabled to provide a generally constant current source for differential amplifier 12. When timing signal CLK0B is at a higher potential relative to timing signal CLK0, transistor 28 conducts more current than transistor 34, which causes the voltage potential at the drain terminal of transistor 28 to fall and the voltage potential at the drain terminal of transistor 34 to rise. Because the input terminal of inverter 36 is electrically connected to the drain terminal of transistor 34, the input terminal of inverter 36 is also driven to a higher potential, which, in turn, pulls critical edge timing signal P0H to a lower potential. It will be appreciated by those skilled in the art that transistors 26, 32 function as loads for differential buffer 12, and that transistor 26 is set for biasing as a voltage divider.

Upon the ensuing transition of the timing signals CLK0 and CLK0B, wherein CLK0 rises to a higher potential relative to CLK0B, transistor 34 conducts more current than transistor 28, pulling the input terminal of inverter 36 down to a lower potential. This, in turn, causes the critical edge timing signal P0H to be driven to a higher potential.

Those skilled in the art will appreciate that in differential amplifier circuits, such as those illustrated in FIG. 3 and FIG. 4, transistors 28, 34 preferably have generally matched characteristics. Further, it will be appreciated that, for differential buffer 12, the response to the rising edge of the CLK0 signal, which is applied to the gate electrode of transistor 34, is generally faster than the response to the rising edge of the CLK0B signal, which is applied to the gate electrode of transistor 28.

It will also be appreciated that the timing signals P0H, P0L, P1H and P1L shown in FIG. 1 can be generated by circuitry such as that shown in FIG. 3. Alternatively, those signals can be generated by the circuitry shown in FIG. 4, which is practically identical to the circuitry illustrated in FIG. 3, but does not include inverter 36 included in the circuitry illustrated in FIG. 3.

Figure 5:
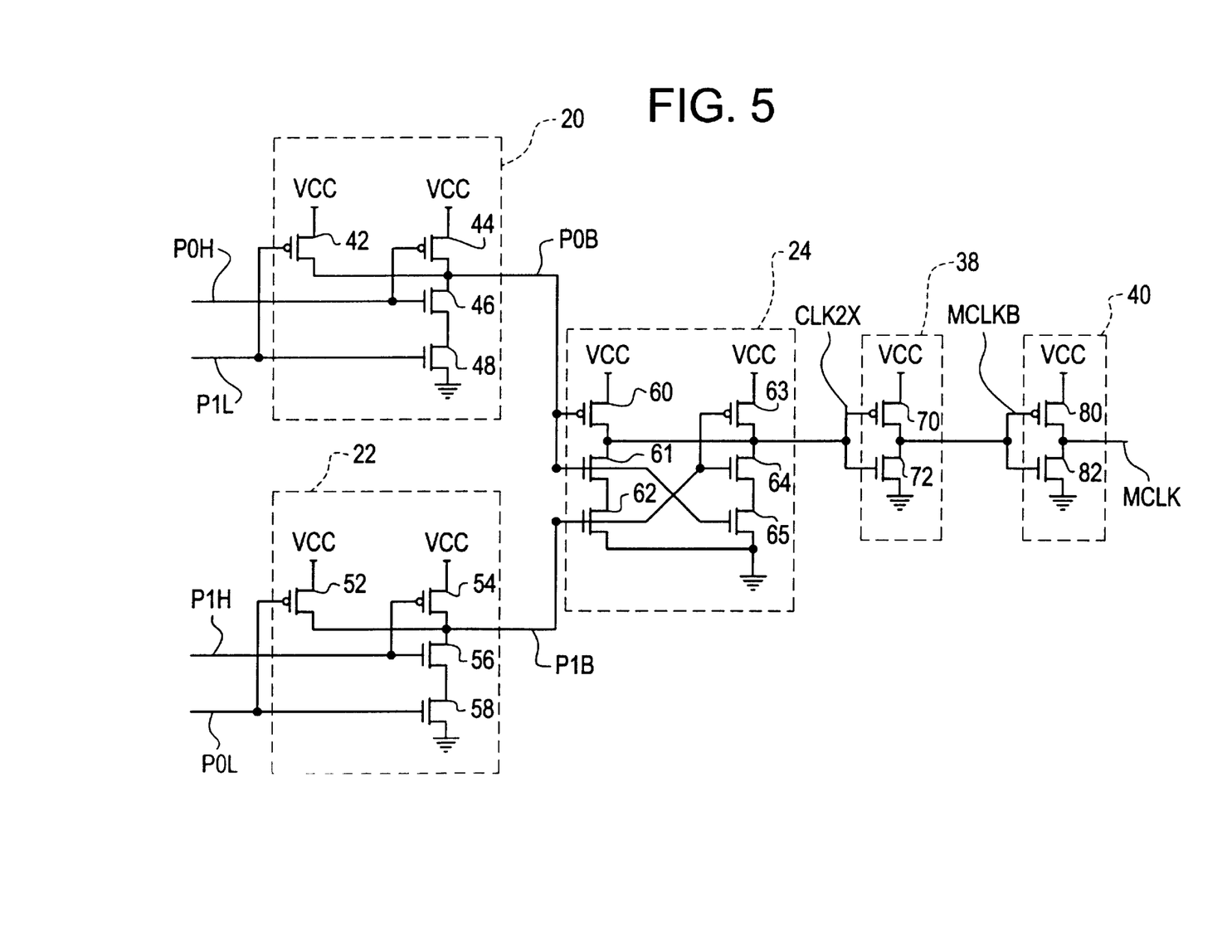
FIG. 5 is a circuit schematic diagram illustrating components preferably included within that portion of the circuitry depicted in schematic form in FIG. 1 that performs an exclusive-or (XOR) function.

FIG. 5 illustrates a circuit schematic diagram depicting a representative integrated circuit that can be used to construct NAND gates 20, 22 and 24 shown in FIG. 1. As shown, NAND gates 20 and 22 are shown in their conventional form using CMOS technology. NAND gate 24 is represented in its preferred form as a low skew NAND gate using CMOS technology. It will be appreciated by those skilled in the art that NAND gates 20 and 22 could also be constructed using a low skew NAND gate such as that represented for NAND gate 24 in FIG. 5.

Also shown in FIG. 5 are a pair of inverters 38, 40. Both of those inverters are shown as being constructed using CMOS technology. They function as buffers to provide gain that will permit the circuit to drive a capacitive load, such as a bus.

NAND gate 20 is represented by four transistors 42, 44, 46 and 48. Transistors 42 and 44 are illustratively shown as PMOS transistor devices, while transistors 46 and 48 are illustratively shown as NMOS transistor devices. The source terminal of transistor 42 is electrically connected to a VCC voltage source, while critical edge timing signal P1L is applied to its gate electrode. The drain terminal of transistor 42 is electrically connected to the juncture between transistors 44 and 46 and also to an input terminal for NAND gate 24, as it carries signal P0B.

For transistor 44, a VCC voltage source is applied to its source terminal, critical edge timing signal P0H is applied to its gate electrode, and its drain terminal is electrically connected to the source terminal for transistor 42, the drain terminal for transistor 46 and an input terminal for NAND gate 24, as it carries signal P0B.

Transistor 46 is electrically connected in series between transistors 44 and 48. Transistor 46 is controlled by critical edge timing signal P0H, which is applied to its gate electrode.

For transistor 48, its drain terminal is electrically connected to the source terminal of transistor 46 and its source terminal is electrically connected to VSS or ground potential. Transistor 48 is controlled by critical edge timing signal P1L, which is applied to its gate electrode. Those skilled in the art will appreciate that the size ratios of the P-channel and the effective N-channel formed by the series-connected transistors 46, 48 are preferably adjusted for optimum circuit performance.

In operation, NAND gate 20 receives as its input signals the critical edge timing signals P0H and P1L, and produces an output signal applied to an input terminal of NAND gate 24. As is generally the case with two-input digital gates, four different conditions are possible. In the first such condition, critical edge timing signals P0H and P1L are both LOW. Under such circumstances, transistors 42 and 44 are turned ON (i.e., enabled), while transistors 46 and 48 are turned OFF (i.e., disabled). As a result, the output signal P0B of NAND gate 20 is driven to VCC potential.

In the second condition, critical edge timing signal P0H is LOW, while critical edge timing signal P1L is HIGH. Under such circumstances, transistors 44 and 48 are turned ON, while transistors 42 and 46 are turned OFF. As a result, the output signal P0B of NAND gate 20 is driven to VCC potential.

In the third condition, critical edge timing signal P0H is HIGH, while critical edge timing signal P1L is LOW. Under such circumstances, transistors 42 and 46 are turned ON, while transistors 44 and 48 are turned OFF. As a result, the output signal P0B of NAND gate 20 is driven to VCC potential.

In the final (fourth) condition, both critical edge timing signals P0H and P1L for NAND gate 20 are HIGH. This causes transistors 42 and 44 to be turned OFF, while transistors 46 and 48 are turned ON. As a result, the output signal P0B for NAND gate 20 is pulled down to VSS or ground potential.

NAND gate 22 is also represented by four transistors 52, 54, 56 and 58 that are electrically connected and function identically as transistors 42, 44, 46 and 48 for NAND gate 20. Transistors 52 and 54 are illustratively shown as PMOS transistor devices, while transistors 56 and 58 are illustratively shown as NMOS transistor devices. The source terminal of transistor 52 is electrically connected to a VCC voltage source, while critical edge timing signal P0L is applied to its gate electrode. The drain terminal of transistor 52 is electrically connected to the juncture between transistors 54 and 56 and also to an input terminal for NAND gate 24, as it carries signal P1B.

For transistor 54, a VCC voltage source is applied to its source terminal, critical edge timing signal P1H is applied to its gate electrode, and its drain terminal is electrically connected to the source terminal for transistor 52, the drain terminal for transistor 56 and an input terminal for NAND gate 24, as it carries signal P1B.

Transistor 56 is electrically connected in series between transistors 54 and 58. Transistor 56 is controlled by critical edge timing signal P1H, which is applied to its gate electrode.

For transistor 58, its drain terminal is electrically connected to the source terminal of transistor 56 and its source terminal is electrically connected to VSS or ground potential. Transistor 58 is controlled by critical edge timing signal P0L, which is applied to its gate electrode. Those skilled in the art will appreciate that the size ratios of the P-channel and the effective N-channel formed by the series-connected transistors 56, 58 are preferably adjusted for optimum circuit performance.

In operation, NAND gate 22 receives as its input signals the critical edge timing signals P1H and P0L, and produces an output signal applied to an input terminal of NAND gate 24. As is generally the case with two-input digital gates, four different conditions are possible. In the first such condition, critical edge timing signals P1H and P0L are both LOW. Under such circumstances, transistors 52 and 54 are turned ON (i.e., enabled), while transistors 56 and 58 are turned OFF (i.e., disabled). As a result, the output signal P1B of NAND gate 22 is driven to VCC potential.

In the second condition, critical edge timing signal P1H is LOW, while critical edge timing signal P0L is HIGH. Under such circumstances, transistors 54 and 58 are turned ON, while transistors 52 and 56 are turned OFF. As a result, the output signal P1B of NAND gate 22 is driven to VCC potential.

In the third condition, critical edge timing signal P1H is HIGH, while critical edge timing signal P0L is LOW. Under such circumstances, transistors 52 and 56 are turned ON, while transistors 54 and 58 are turned OFF. As a result, the output signal P1B of NAND gate 22 is driven to VCC potential.

In the final (fourth) condition, both critical edge timing signals P1H and P0L for NAND gate 22 are HIGH. This causes transistors 52 and 54 to be turned OFF, while transistors 56 and 58 are turned ON. As a result, the output signal P1B for NAND gate 22 is pulled down to VSS or ground potential.

Referring to NAND gate 24, it receives as input signals the output signals P0B and P1B produced by NAND gates 20 and 22, respectively, and produces a double frequency timing signal CLK2X that is applied to the input terminal of buffer/inverter 38. Low skew NAND gate 24 is shown to include six transistors 60–65. Transistors 60–62 are electrically connected in series, as are transistors 63–65. In addition, transistors 60–62 are electrically connected in parallel with transistors 63–65, and furthermore there is cross electrical connection between them to obtain the desired low skew for NAND gate 24.

Furthermore, in its preferred form, NAND gate 24 provides equivalent loading and equivalent response due to the matched characteristics of transistors 60–65.

Transistors 60 and 63 are shown illustratively as PMOS transistor devices, while transistors 61, 62, 64 and 65 are shown illustratively as NMOS transistor devices. For transistor 60, a VCC potential voltage source is applied to its source terminal, the output signal P0B produced by NAND gate 20 is applied to its gate electrode and its gate electrode is electrically connected to the gate electrodes for transistors 61 and 65, respectively, and its drain terminal is electrically connected to the drain terminal of transistor 61, the drain terminal of transistor 63, and carries the double frequency timing signal CLK2X produced by NAND gate 24.

For transistor 61, its drain terminal is electrically connected to the drain terminals of transistors 60 and 63, and it caries the double frequency timing signal CLK2X produced by NAND gate 24. The output signal P0B produced by NAND gate 20 is applied to the gate electrode of transistor 61, which is electrically connected to the gate electrode of transistor 65. The source terminal of transistor 61 is electrically connected to the drain terminal of transistor 62.

For transistor 62, its drain terminal is electrically connected to the source terminal of transistor 61, the output signal P1B produced by NAND gate 22 is applied to its gate electrode, which is electrically connected to the gate electrodes of transistors 63 and 64, and its source terminal is electrically connected to the source terminal of transistor 65, which is also electrically connected to a VSS or ground potential voltage.

For transistor 63, a VCC voltage source is applied to its source terminal, the output signal P1B produced by NAND gate 22 is applied to its gate electrode, which is electrically connected to the gate electrodes of transistors 62 and 64, and its drain terminal is electrically connected to the juncture between transistors 60 and 61 at their drain terminals and to the drain terminal of transistor 64 to carry the double frequency timing signal CLK2X.

For transistor 64, its drain terminal is electrically connected to the drain terminal of transistor 63 and to the juncture between transistors 60 and 61 at their drain terminals to carry the double frequency timing signal CLK2X, the output signal P1B produced by NAND gate 22 is applied to its gate electrode, which is electrically connected to the gate electrodes of transistors 62 and 63, and its source terminal is electrically connected to the drain terminal of transistor 65.

For transistor 65, its drain terminal is electrically connected to the source terminal of transistor 64, the output signal P0E produced by NAND gate 20 is applied to its gate electrode, which is electrically connected to the gate electrodes of transistors 60 and 61, and its source terminal is electrically connected to the source terminal of transistor 62 and a VSS or ground potential voltage.

The operation of NAND gate 24 depends upon the signals P0B and P1B generated by NAND gates 20 and 22, respectively, as previously described. There are four possible conditions that affect operation of NAND gate 24. In a first condition, the output signal P0B of NAND gate 20 and the output signal P1B of NAND gate 22 are both LOW. This causes transistors 60 and 63 to be turned ON, while transistors 61, 62, 64 and 65 are turned OFF. As a result, the double frequency timing signal CLK2X produced by NAND gate 24 is driven to VCC potential.

In a second condition, the output signal P0B generated by NAND gate 20 is LOW, while the output signal P1B generated by NAND gate 22 is HIGH. This causes transistors 60, 62 and 64 to be turned ON, while transistors 61, 63 and 65 are turned OFF. As a result, the double frequency timing signal CLK2X produced by NAND gate 24 is driven to VCC potential.

In a third condition, the output signal P0E produced by NAND gate 20 is HIGH, while the output signal P1B produced by NAND gate 22 is LOW. This causes transistors 61, 63 and 65 to be turned ON, while transistors 60, 62 and 64 are turned OFF. As a result, the double frequency timing signal CLK2X is driven to VCC potential.

In a fourth (final) condition, both output signals P0B and P1B produced by NAND gates 20 and 22, respectively, are HIGH, turning transistors 61, 62, 64 and 65 ON, while turning transistors 60 and 63 OFF. As a result, the double frequency timing signal CLK2X produced by NAND gate 24 is pulled down to VSS for ground potential.

As will be appreciated by those skilled in the art, together, NAND gates 20, 22 and 24, as electrically coupled, perform an exclusive-or (XOR) function in such a way as to produce the double frequency timing signal CLK2X.

Double frequency timing signal CLK2X is applied to the input terminal of buffer/inverter 38, represented in FIG. 4 as a pair of series-connected transistors 70, 72. Transistor 70 is shown illustratively as a PMOS transistor device, while transistor 72 is shown illustratively as an NMOS transistor device.

For transistor 70, a VCC potential voltage source is applied to its source terminal, the double frequency timing signal CLK2X is applied to its gate electrode, which is electrically connected to the gate electrode of transistor 72, and its drain terminal is electrically connected to the drain terminal of transistor 72 and to the input terminal of buffer/inverter 40.

For transistor 72, its drain terminal is electrically connected to the drain terminal for transistor 70 and to the input terminal of buffer/inverter 40, the double frequency timing signal CLK2X is applied to its gate electrode, which is electrically connected to the gate electrode of transistor 70, and its drain terminal is electrically connected to a VSS or ground potential voltage.

In operation, buffer/inverter 38 receives as its input signal the double frequency timing signal CLK2X and generates an output signal MCLKB that is generally the complement of double frequency timing signal CLK2X. When double frequency timing signal CLK2X is HIGH, transistor 70 is turned OFF and transistor 72 is turned ON. As a result, the output signal MCLKB for buffer/inverter 38 is pulled down to VSS or ground potential. Alternatively, when CLK2X is LOW, transistor 70 is turned ON, while transistor 72 is turned OFF. As a result, the output signal MCLKB for buffer/inverter 38 is driven to VCC potential.

The output signal MCLKB for buffer/inverter 38 is applied to the input terminal of buffer/inverter 40, also represented in FIG. 4 as a pair of series-connected transistors 80, 82. Transistor 80 is shown illustratively as a PMOS transistor device, while transistor 82 is shown illustratively as an NMOS transistor device.

For transistor 80, a VCC potential voltage source is applied to its source terminal, the output signal MCLKB for buffer/inverter 38 is applied to its gate electrode, which is electrically connected to the gate electrode of transistor 82, and its drain terminal is electrically connected to the drain terminal of transistor 82 and to an output line for carrying output signal MCLK.

For transistor 82, its drain terminal is electrically connected to the drain terminal for transistor 80 and to the output line for carrying output signal MCLK, output signal MCLKB for buffer/inverter 38 is applied to its gate electrode, which is electrically connected to the gate electrode of transistor 80, and its drain terminal is electrically connected to a VSS or ground potential voltage.

In operation, buffer/inverter 40 receives as its input signal the output signal MCLKB for buffer/inverter 38 and generates an output signal MCLK that is the complement of that signal. When the MCLKB signal is HIGH, transistor 80 is turned OFF and transistor 82 is turned ON. As a result, the output signal MCLK for buffer/inverter 40 is pulled down to VSS or ground potential. Alternatively, when MCLKB is LOW, transistor 80 is turned ON, while transistor 82 is turned OFF. As a result, the output signal MCLK for buffer/inverter 40 is driven to VCC potential.

It will be appreciated by those skilled in the art that, together, inverters 38, 40 function to permit the circuitry to drive a capacitive load, such as a bus. As a result of the circuitry shown in FIGS. 3, 4 and 5, a low skew double frequency timing signal is generated using the lowest skew path for each transition of the multi-phase input clock signals CLK0, CLK0B, CLK1 and CLK1B.

While this invention has been described with reference to illustrative embodiments, it will be understood that this description shall not be construed in a limiting sense. Rather, various changes and modifications can be made to the illustrative embodiments without departing from the true spirit and scope of the invention, as defined by the following claims. For example, as described before, the circuitry shown in FIG. 5 for NAND gate 24 could be used to implement NAND gates 20 and 22, and an even lower skew double frequency timing signal would be produced thereby. As another example, it will be appreciated that a reference voltage could be used as an input to each of the multi-phase input buffers to generate the appropriate critical edge timing signals, provided that the use is consistent, and the reference voltage is applied to the same input terminal (inverting or noninverting) for each input buffer. It will furthermore be appreciated that any changes and modifications to the illustrative embodiments would be regarded by those skilled in the art as at least an equivalent to one element or more of the following claims, and shall be covered by such claims to the fullest extent permitted by law.

What is claimed is:

1. A timing signal generation circuit for generating a timing signal having a predetermined number of critical transitions from a plurality of input timing signals, comprising:

a) an input differential buffer for each said critical transition of said timing signal, each said buffer having first and second input terminals and an output terminal, each said buffer further having a first response between its said first input terminal and its said output terminal and a second response between its said second input terminal and its said output terminal, said first response providing a generally lower skew than said second response, and wherein two different ones of said input timing signals are applied to said first and second input terminals of each said buffer to generate a critical edge timing signal at an output terminal of each said buffer indicative of a lowest skew path for a particular one of said predetermined number of critical transitions of said timing signal; and b) a logic circuit coupled to each said buffer through the respective output terminals for each said buffer.

2. The timing signal generation circuit as defined by claim 1 wherein said first input terminals of said buffers are noninverting input terminals and said second input terminals of said buffers are inverting input terminals.

3. The timing signal generation circuit as defined by claim 1 wherein said plurality of input timing signals comprises a first input timing signal, a second input timing signal, a third input timing signal and a fourth input timing signal.

4. The timing signal generation circuit as defined by claim 3 wherein said plurality of input timing signals share a common frequency.

5. The timing signal generation circuit as defined by claim 4 wherein said first input timing signal and said second input timing signal are complements, and said third input timing signal and said fourth input timing signal are complements.

6. The timing signal generation circuit as defined by claim 5 wherein said first input timing signal is ninety degrees out of phase with respect to said third input timing signal.

7. The timing signal generation circuit as defined by claim 1 wherein said plurality of input timing signals consists of a first input timing signal, a second input timing signal, a third input timing signal and a fourth input timing signal.

8. The timing signal generation circuit as defined by claim 7 wherein said plurality of input timing signals share a common frequency.

9. The timing signal generation circuit as defined by claim 8 wherein said first input timing signal and said second input timing signal are complements, and said third input timing signal and said fourth input timing signal are complements.

10. The timing signal generation circuit as defined by claim 9 wherein said first input timing signal is ninety degrees out of phase with respect to said third input timing signal.

11. The timing signal generation circuit as defined by claim 1 wherein said predetermined number of critical transitions comprises a first critical transition, a second critical transition, a third critical transition and a fourth critical transition, and there are four input differential buffers comprising a first input differential buffer associated with said first critical transition, a second input differential buffer associated with said second critical transition, a third input differential buffer associated with said third critical transition, and a fourth input differential buffer associated with said fourth critical transition.

12. The timing signal generation circuit as defined by claim 1 wherein said predetermined number of critical transitions consists of a first critical transition, a second critical transition, a third critical transition and a fourth critical transition, and there are four input differential buffers consisting of a first input differential buffer associated with said first critical transition, a second input differential buffer associated with said second critical transition, a third input differential buffer associated with said third critical transition, and a fourth input differential buffer associated with said fourth critical transition.

13. The timing signal generation circuit as defined by claim 12 wherein said first input differential buffer generates a first critical edge timing signal applied to said logic circuit, said second input differential buffer generates a second critical edge timing signal applied to said logic circuit, said third input differential buffer generates a third critical edge timing signal applied to said logic circuit, and said fourth input differential buffer generates a fourth critical edge timing signal applied to said logic circuit.

14. The timing signal generation circuit as defined by claim 1 wherein said logic circuit comprises a first logic gate, a second logic gate coupled to the first logic gate, and a third logic gate coupled to the first logic gate.

15. The timing signal generation circuit as defined by claim 14 wherein said first logic gate comprises a NAND gate, said second logic gate comprises a NAND gate, and said third logic gate comprises a NAND gate.

16. The timing signal generation circuit as defined by claim 15 wherein said first logic gate comprises a low skew NAND gate.

17. The timing signal generation circuit as defined by claim 1 wherein said logic circuit performs an exclusive-or function.

18. A clock doubler circuit for generating a double frequency clock signal from first, second, third and fourth input clock signals wherein the first and second input clock signals share a common frequency and are complements of each other, the third and fourth input clock signals share said common frequency and are complements of each other, and the first and third input clock signals are ninety degrees out of phase with respect to each other, the clock doubler circuit comprising:

a) a first input differential buffer having a first buffer first input terminal, a first buffer second input terminal, and a first buffer output terminal, the first input clock signal being applied to the first buffer first input terminal and the second input clock signal being applied to the first buffer second input terminal;

b) a second input differential buffer having a second buffer first input terminal, a second buffer second input terminal, and a second buffer output terminal, the fourth input clock signal being applied to the second buffer first input terminal and the third input clock signal being applied to the second buffer second input terminal;

c) a third input differential buffer having a third buffer first input terminal, a third buffer second input terminal, and a third buffer output terminal, the third input clock signal being applied to the third buffer first input terminal and the fourth input clock signal being applied to the third buffer second input terminal;

d) a fourth input differential buffer having a fourth buffer first input terminal, a fourth buffer second input terminal, and a fourth buffer output terminal, the second input clock signal being applied to the fourth buffer first input terminal and the first input clock signal being applied to the fourth buffer second input terminal; and e) an exclusive-or logic circuit coupled to said first, second, third and fourth input differential buffers through respective ones of said first, second, third and fourth buffer output terminals.

19. The clock doubler circuit as defined by claim 18 wherein said first, second, third and fourth input differential buffers have a first response between their respective first input terminals and their respective output terminals and a second response between their respective second input terminals and their respective output terminals, said first response providing a generally lower skew than said second response.

20. The clock doubler circuit as defined by claim 18 wherein said first input terminals are noninverting input terminals and said second input terminals are inverting input terminals.

21. The clock doubler circuit as defined by claim 18 wherein said first input differential buffer generates a first critical edge timing signal applied to said exclusive-or logic circuit, said second input differential buffer generates a second critical edge timing signal applied to said exclusive-or logic circuit, said third input differential buffer generates a third critical edge timing signal applied to said exclusive-or logic circuit, and said fourth input differential buffer generates a fourth critical edge timing signal applied to said exclusive-or logic circuit.

22. The clock doubler circuit as defined by claim 18 wherein said exclusive-or logic circuit comprises a first logic gate, a second logic gate coupled to the first logic gate, and a third logic gate coupled to the first logic gate.

23. The clock doubler circuit as defined by claim 22 wherein said first logic gate comprises a NAND gate, said second logic gate comprises a NAND gate, and said third logic gate comprises a NAND gate.

24. The clock doubler circuit as defined by claim 23 wherein said first logic gate comprises a low skew NAND gate.

* * * * *